United States Patent
Ren et al.

(10) Patent No.: US 10,170,299 B2
(45) Date of Patent: Jan. 1, 2019

(54) METHOD TO REDUCE TRAP-INDUCED CAPACITANCE IN INTERCONNECT DIELECTRIC BARRIER STACK

(71) Applicant: Applied Materials, Inc., Santa Clara, CA (US)

(72) Inventors: He Ren, San Jose, CA (US); Mehul B. Naik, San Jose, CA (US); Yong Cao, San Jose, CA (US); Yana Cheng, San Jose, CA (US); Weifeng Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 10 days.

(21) Appl. No.: 15/186,436

(22) Filed: Jun. 18, 2016

(65) Prior Publication Data
US 2017/0005041 A1    Jan. 5, 2017

Related U.S. Application Data

(60) Provisional application No. 62/187,582, filed on Jul. 1, 2015.

(51) Int. Cl.
*H01L 21/02*    (2006.01)
*H01L 21/768*   (2006.01)

(52) U.S. Cl.
CPC ...... *H01L 21/02167* (2013.01); *H01L 21/022* (2013.01); *H01L 21/02126* (2013.01); *H01L 21/02274* (2013.01); *H01L 21/02362* (2013.01); *H01L 21/76826* (2013.01); *H01L 21/76832* (2013.01)

(58) Field of Classification Search
CPC ......... H01L 23/53295; H01L 21/76832; H01L 21/02126; H01L 21/02167; H01L 21/02178; H01L 21/02329; H01L 23/528
See application file for complete search history.

(56) References Cited

U.S. PATENT DOCUMENTS

| | | | |
|---|---|---|---|
| 2004/0152239 A1* | 8/2004 | Bao ................... | H01L 21/76829 438/118 |
| 2010/0200995 A1* | 8/2010 | Monnoyer ........ | H01L 21/02063 257/773 |
| 2012/0032311 A1* | 2/2012 | Gates ................ | H01L 21/02126 257/635 |
| 2012/0122312 A1* | 5/2012 | King ................. | H01L 21/76829 438/675 |
| 2014/0252648 A1 | 9/2014 | Chen et al. | |
| 2014/0256154 A1 | 9/2014 | Bonilla et al. | |

(Continued)

OTHER PUBLICATIONS

International Search Report and Written Opinion for PCT/US2016/039881 dated Oct. 11, 2016.

*Primary Examiner* — A. Sefer
(74) *Attorney, Agent, or Firm* — Patterson + Sheridan, LLP

(57) ABSTRACT

The present disclosure provides an interconnect formed on a substrate and methods for forming the interconnect on the substrate. In one embodiment, the method for forming an interconnect on a substrate includes depositing a barrier layer on the substrate, depositing a transition layer on the barrier layer, and depositing an etch-stop layer on the transition layer, wherein the transition layer shares a common element with the barrier layer, and wherein the transition layer shares a common element with the etch-stop layer.

11 Claims, 6 Drawing Sheets

(56) References Cited

U.S. PATENT DOCUMENTS

2014/0264874 A1* 9/2014 Sung .................. H01L 23/5329
257/751
2014/0264903 A1* 9/2014 Chen .................. H01L 23/5329
257/774
2016/0293475 A1* 10/2016 Gu .................... H01L 21/76802

* cited by examiner

METHOD TO REDUCE TRAP-INDUCED CAPACITANCE IN INTERCONNECT DIELECTRIC BARRIER STACK

CROSS-REFERENCE TO RELATED APPLICATIONS

This application claims priority from U.S. Provisional Application Ser. No. 62/187,582, filed Jul. 1, 2015, which is hereby incorporated by reference in its entirety.

BACKGROUND

Field

Embodiments of the present disclosure generally relate to methods for forming an interconnect on a substrate, and more particularly to forming an interconnect with improved bonding between the layers of the interconnect.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

Thus, there is a need for improved methods for forming interconnects to continue to decrease the manufacturing costs, memory cell size, and power consumption of the integrated circuits.

SUMMARY

In one embodiment, a method for forming an interconnect on a substrate is disclosed herein. The method includes depositing a barrier layer on the substrate, depositing a transition layer on the barrier layer, and depositing an etch-stop layer on the transition layer, wherein the transition layer shares a common element with the barrier layer, and wherein the transition layer shares a common element with the etch-stop layer.

In another embodiment, a method for forming an interconnect on a substrate is disclosed herein. The method includes depositing a barrier layer on the substrate, depositing a transition layer on the barrier layer, depositing an etch-stop layer on the transition layer, and treating an interface between the barrier layer and the transition layer such that the barrier layer and the transition layer share a common element.

In one embodiment, an interconnect formed on a substrate is disclosed herein. The interconnect includes a barrier layer on the substrate, a transition layer on the barrier layer, and an etch-stop layer on the transition layer, wherein the transition layer shares a common element with the barrier layer, and wherein the transition layer shares a common element with the etch-stop layer.

BRIEF DESCRIPTION OF THE DRAWINGS

So that the manner in which the above recited features of the present disclosure can be understood in detail, a more particular description of the present disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the present disclosure may admit to other equally effective embodiments.

DETAILED DESCRIPTION

Figure 1:
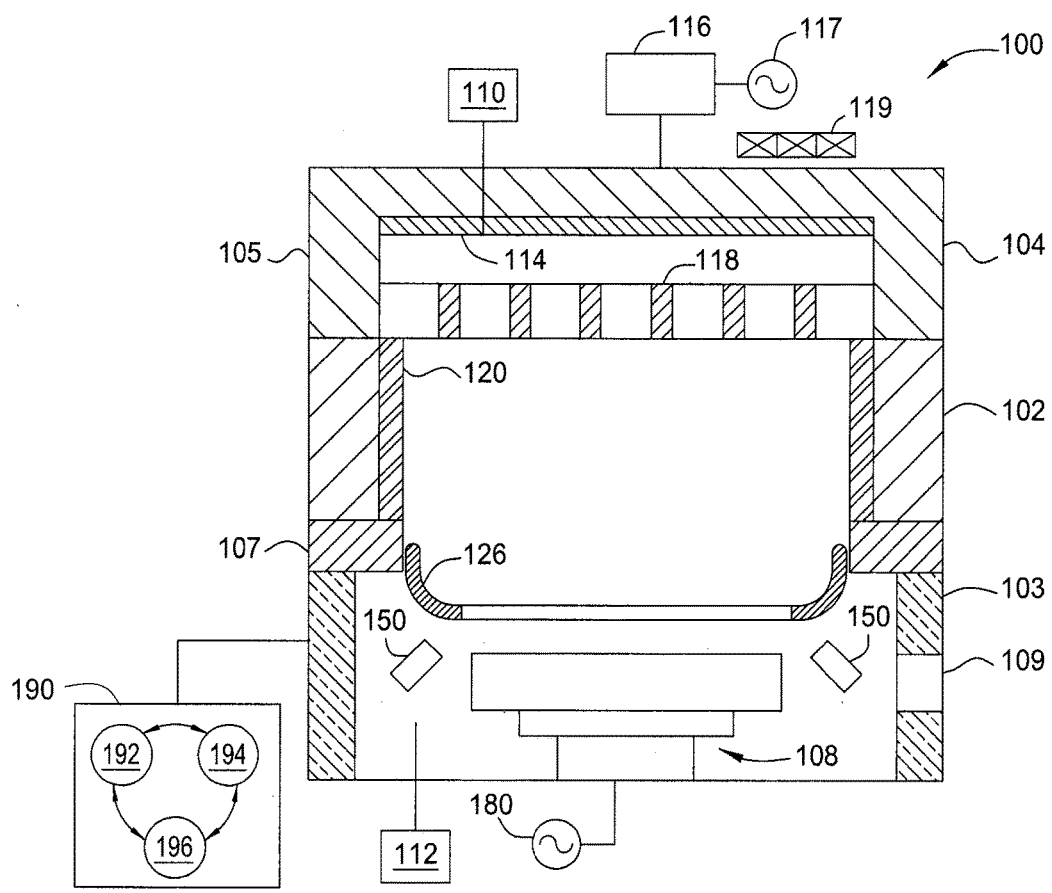
FIG. 1 illustrates an exemplary physical vapor deposition chamber suitable for sputter depositing materials, according to one embodiment.

FIG. 1 illustrates an exemplary physical vapor deposition (PVD) chamber 100 suitable for sputter depositing materials according to one embodiment. Examples of suitable PVD chambers include ALPS® Plus and SIP ENCORE® PVD processing chambers, both commercially available from Applied Materials, Inc., Santa Clara, Calif. It is contemplated that processing chambers available from other manufacturers may also be adapted to perform the embodiments described herein.

FIG. 1 is a schematic cross-sectional view of a process chamber 100 according to one embodiment. The process chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103. A substrate support, such as pedestal 108, is disposed in the interior volume 106 of the process chamber

100. A substrate transfer port 109 is formed in the lower sidewall 103 for transferring substrates into and out of the interior volume 106.

A gas source 110 is coupled to the process chamber 100 to supply process gases into the interior volume 106. In one embodiment, process gases may include inert gases, non-reactive gases, and reactive gases if necessary. A pumping device 112 is coupled to the process chamber 100 in communication with the interior volume 106 to control the pressure of the interior volume 106.

The lid portion 104 may support a sputtering source 114, such as a target. The sputtering source 114 may be coupled to a source assembly 116 comprising a power supply 117 for the sputtering source 114. A set of magnets 119 may be coupled adjacent to the sputtering source 114, which enhances efficient sputtering materials from the sputtering source 114 during processing.

An additional RF power source 180 may also be coupled to the process chamber 100 through the pedestal 108 to provide a bias power between the sputtering source 114 and the pedestal 108 as needed.

A collimator 118 may be positioned in the interior volume 106 between the sputtering source 114 and the pedestal 108. A shield tube 120 may be in proximity to the collimator 118 and the interior of the lid portion 104. A shield ring 126 may be disposed in the chamber 100 adjacent to the shield tube 120.

The process chamber 100 may further include lamps 150 that provide optical and/or radiant energy in the visible or near visible wavelength, such as in the infra-red (IR) and/or the ultraviolet (UV) spectrum.

A controller 190 is coupled to the process chamber 100. The controller 190 includes a central processing unit (CPU) 192, a memory 194, and support circuits 196. The controller 190 is utilized to control the process sequence, regulating the gas flows from the gas source 110 into the process chamber 100 and controlling ion bombardment of the sputtering source 114. The CPU 192 may be of any form of a general purpose computer processor that can be used in an industrial setting. The software routines can be stored in the memory 194, such as random access memory, read only memory, floppy or hard disk drive, or other form of digital storage. The support circuits 196 are conventionally coupled to the CPU 192 and may comprise cache, clock circuits, input/output subsystems, power supplies, and the like. The software routines, when executed by the CPU 192, transform the CPU 192 into a specific purpose computer (controller) 190 that controls the process chamber 100 such that the processes are performed in accordance with the present disclosure. The software routines may also be stored and/or executed by a second controller (not shown) that is located remotely from the chamber.

Figure 2:
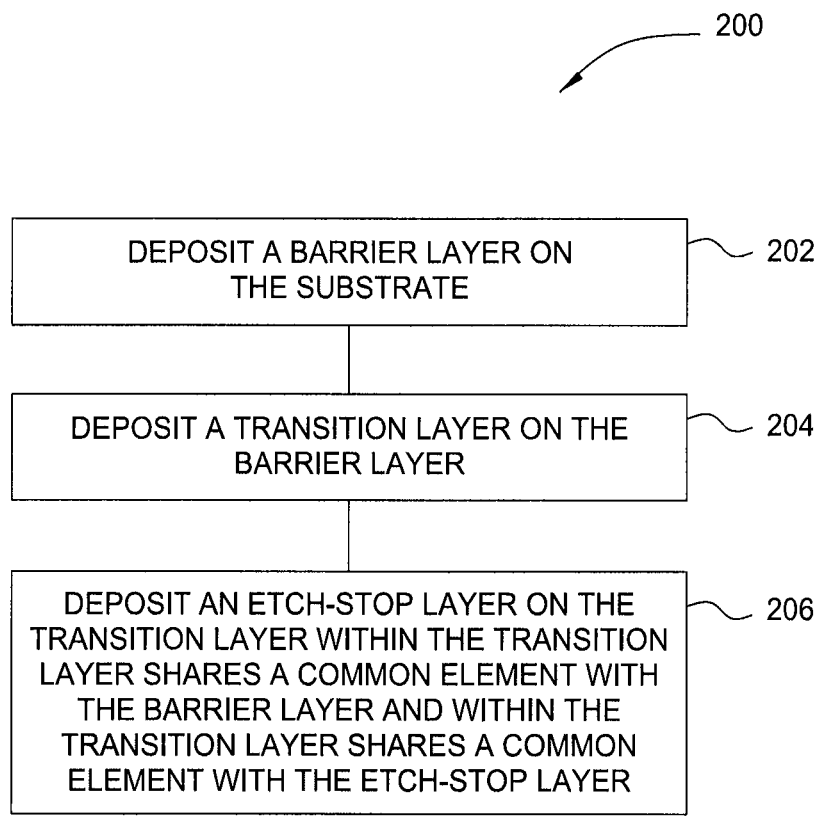
FIG. 2 is a flow diagram that illustrates a method of forming an interconnect on a substrate, according to one embodiment.
Figure 3A:
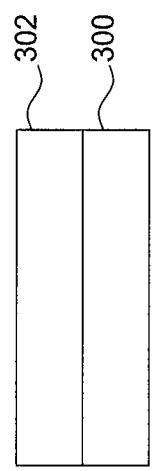
FIGS. 3A-3C illustrate an interconnect formed on a substrate at intervals of the method in FIG. 2.

FIG. 2 is a flow diagram that illustrates one embodiment of a method 200 for forming an interconnect on a substrate. FIGS. 3A-3D illustrate cross-sectional views of the substrate at different stages of the method 200 of FIG. 2. The method 200 begins at block 202 by depositing a barrier layer 302 on the substrate 300. FIG. 3A depicts the substrate 300 having the barrier layer 302 deposited thereon. The barrier layer 302 may be deposited through plasma-enhanced chemical vapor deposition (PECVD), PVD, ALD, or other suitable process. The barrier layer may be deposited using a silicon-based precursor. The barrier layer 302 may be a dielectric layer. For example, the barrier layer 302 may be a silicon oxide layer or a silicon nitride layer, or the like.

Figure 3B:
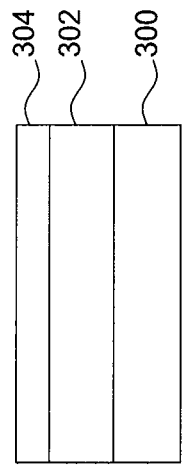

At block 204, a transition layer 304 is deposited on the barrier layer 302, as shown in FIG. 3B. The transition layer 304 may deposited through PECVD, PVD, or other suitable process.

Figure 3C:
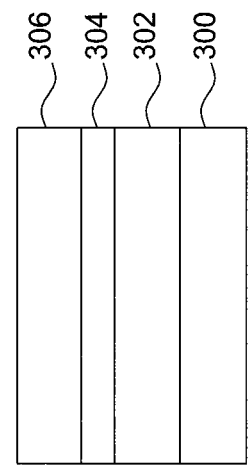

At block 206, an etch-stop layer 306 is deposited over the transition layer 304, as shown in FIG. 3C. The etch-stop layer 306 may be deposited through PECVD, PVD, or other suitable process. The etch-stop layer 306 may be a metal dielectric layer, such as aluminum oxide, aluminum oxynitride, aluminum nitride, tantalum oxide, tantalum nitride, tantalum oxynitride, titanium oxide, titanium nitride, titanium oxynitride, or other suitable metal dielectric layer.

The transition layer 304 is configured to minimize the capacitance penalty by decreasing the fringing capacitance between the barrier layer 302 and the etch-stop layer 306. The fringing capacity between the barrier layer 302 and the etch-stop layer 306 is decreased because the transition layer 304 shares a similar element with both the barrier layer 302 and the etch-stop layer 306. The shared element between the transition layer 304 and the barrier layer 302 allows for a covalent bond to form between the transition layer 304 and the barrier layer 302. Similarly, the shared element between the transition layer 304 and the etch-stop layer 306 allows for a covalent bond to form between the transition layer 304 and the etch-stop layer 306. The covalent bonds formed between the transition layer 304 and the barrier layer 302 and between the transition layer 304 and the etch-stop layer 306 aid in saturating dangling defects, which aids in trap state reduction.

Figure 4:
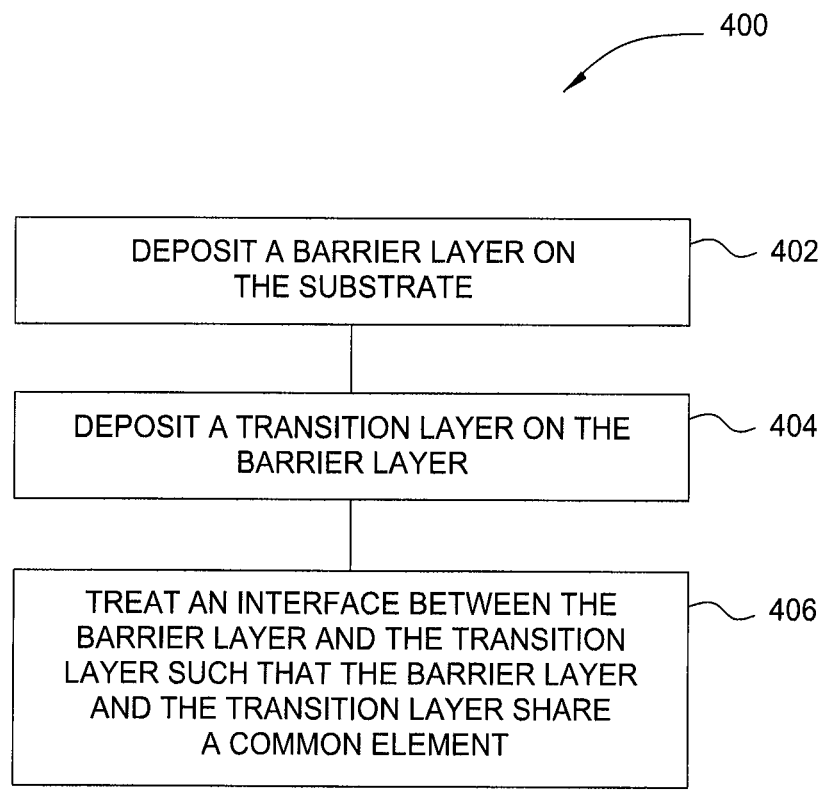
FIG. 4 depicts a method of forming an interconnect on a substrate, according to one embodiment.

FIG. 4 illustrates one embodiment of a method 400 for forming an interconnect on a substrate. FIGS. 5A-5D illustrate cross-sectional views of the substrate at different stages of the method 400 of FIG. 4.

Figure 5B:
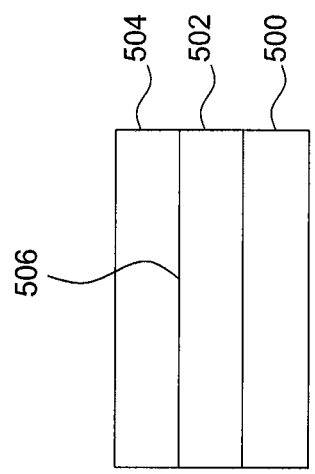
FIG. 5A-5B illustrate an interconnect formed on a substrate at intervals of the method in FIG. 4.
Figure 5A:
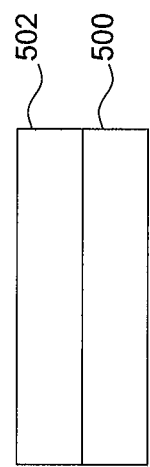

FIG. 5A depicts a substrate 500 having a barrier layer 502 deposited on the substrate 500. The barrier layer 502 may be deposited through PECVD, PVD, or other suitable process. The barrier layer 502 may be a dielectric layer. For example, the barrier layer 502 may be a silicon oxide layer, a silicon nitride layer, or the like.

At block 404, an etch-stop layer 504 is deposited over the barrier layer 502, as illustrated by FIG. 5B. The etch-stop layer 504 may be deposited through PECVD, PVD, or other suitable processes. The etch-stop layer 504 may be a metal dielectric layer, such as aluminum oxide, aluminum oxynitride, aluminum nitride, tantalum oxide, tantalum nitride, tantalum oxynitride, titanium oxide, titanium nitride, titanium oxynitride, or other suitable metal dielectric layers.

An interface 506 is defined between the barrier layer 502 and the etch-stop layer 504. At block 406, the interface 506, defined between the barrier layer 502 and the etch-stop layer 504, is treated such that the barrier layer 502 and the etch-stop layer 504 share a common element. In one embodiment, the interface 506 may undergo a pretreatment process. During the pretreatment process, the barrier layer 502 is doped with an element common to the etch-stop layer 504 to be deposited on the barrier layer 502. In another embodiment, the interface 506 may undergo a post-treatment process. During the post-treatment process, a small molecule penetration approach may be used to dope the surfaces of the dielectric layer and the etch-stop layer with a common element. The small molecule penetration approach includes forming gas ($N_2/H_2$) anneal, hydrogen gas anneal, and hydrogen plasma treatment. Hydrogen, with its small molecular size, has the capability to penetrate though the stack and stitch together the surfaces of the etch-stop and dielectric barrier layers.

Figure 6:
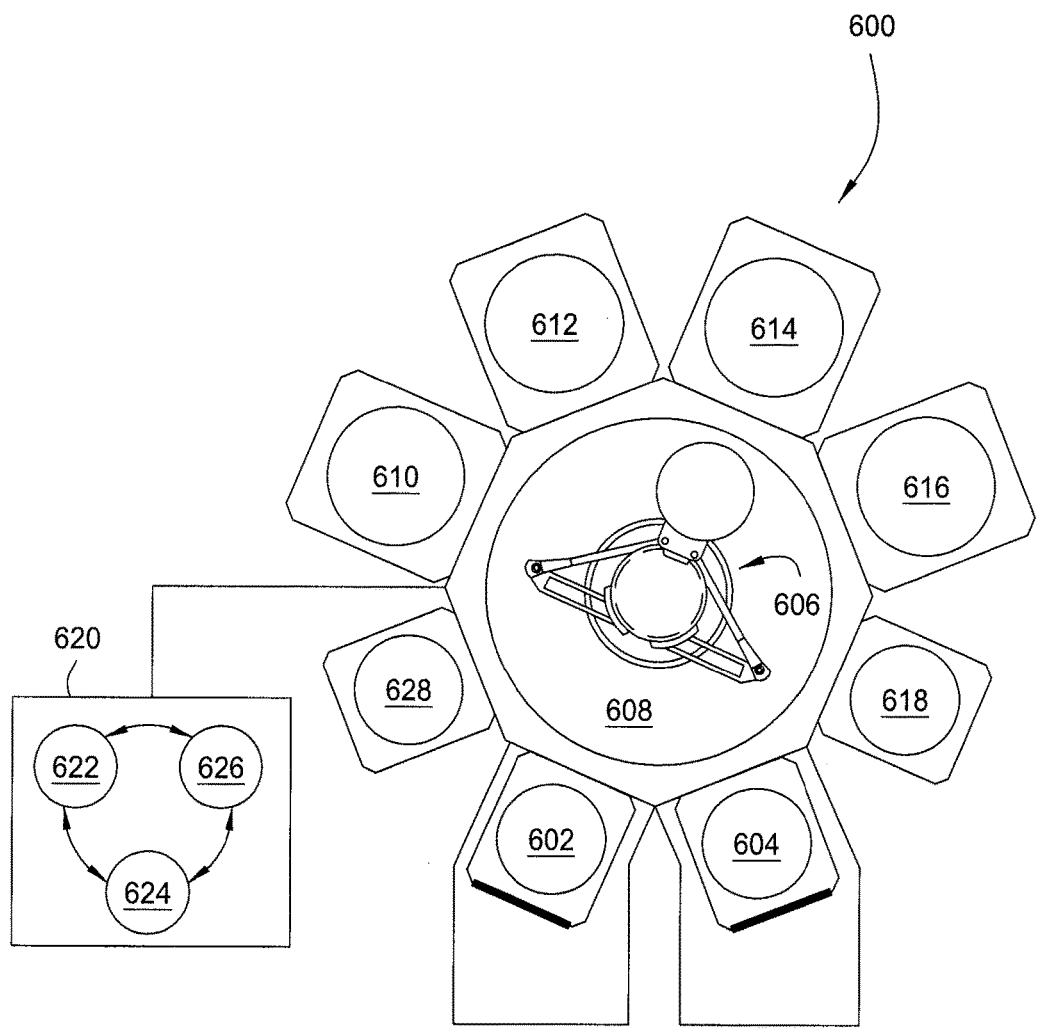
FIG. 6 illustrates a processing system for forming an interconnect on a substrate, according to one embodiment.

FIG. 6 illustrates a multi-chamber processing system 600. The processing system 600 may include load lock chambers 602, 604, a robot 606, a transfer chamber 608, processing chambers 610, 612, 614, 616, 618, 628, and a controller 620. The load lock chambers 602, 604 allow for the transfer of substrates (not shown) into and out of the processing system 600. Load lock chambers 602, 604 may pump down the substrates introduced into the processing system 600 to maintain a vacuum seal. The robot 606 may transfer the substrates between load lock chambers 602, 604 and the processing chambers 610, 612, 614, 616, 618, and 628. The robot 606 may also transfer the substrates between the load lock chambers 602, 604 and the transfer chamber 608.

Each processing chamber 610, 612, 614, 616, 518, and 528 may be outfitted to perform a number of substrate operations such as atomic layer deposition (ALD), chemical vapor deposition (CVD), PVD, etch, pre-clean, de-gas, heat, orientation, or other substrate processes. Additionally, each processing chamber 610, 612, 614, 616, 618, and 628 may be outfitted to deposit an oxide layer, a first adhesion layer, a metal layer, or a second adhesion layer.

The controller 620 may be configured to operate all aspects of the processing system 600, such as the methods disclosed in FIG. 1 and FIG. 3. For example, the controller 620 may be configured to control the method of forming a metal interconnect on a substrate. The controller 620 includes a programmable central processing unit (CPU) 622 that is operable with a memory 624 and a mass storage device, an input control unit, and a display unit (not shown), such as power supplies, clocks, cache, input/output (I/O) circuits, and the liner, coupled to the various components of the processing system to facilitate control of the substrate processing. The controller 620 also includes hardware for monitoring substrate processing through sensors in the processing system 600, including sensors monitoring the precursor, process gas, and purge gas flow. Other sensors that measure system parameters, such as substrate temperature, chamber atmosphere pressure, and the like, may also provide information to the controller 620.

To facilitate control of the processing system 600 described above, the CPU 622 may be one of any form of general purpose computer processor that can be used in an industrial setting, such as a programmable logic controller (PLC), for controlling various chambers and sub-processors. The memory 624 is coupled to the CPU 622 and the memory 624 is non-transitory and may be one or more of readily available memory such as random access memory (RAM), read only memory (ROM), floppy disk drive, hard disk, or any other form of digital storage, local or remote. Support circuits 626 are coupled to the CPU 622 for supporting the processor in a conventional manner. Charged species generation, heating, and other processes are generally stored in the memory 624, typically as software routine. The software routine may also be stored and/or executed by a second CPU (not shown) that is remotely located from the hardware being controlled by the CPU 622.

The memory 624 is in the form of computer-readable storage media that contains instructions, that when executed by the CPU 622, facilitates the operation of the processing system 600. The instructions in the memory 624 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

EXAMPLE ONE

The following example may be carried out using the processing system described in FIG. 6 and the PVD chamber described in FIG. 1. A substrate is transferred to a first processing chamber for deposition of a barrier layer. The first processing chamber is a PECVD chamber. The barrier layer deposited on the substrate is an SiOC barrier layer. The barrier layer may be deposited in a PECVD chamber operated at 2-20 Torr, with a silicon based precursor with in situ plasma oxidation (e.g. $CO_2$ plasma) and/or nitridation (e.g. $NH_3$ plasma).

The robot transfers the substrate having the barrier layer deposited thereon to a second processing chamber for deposition of a transition layer. The second processing chamber is a PECVD processing chamber. The transition layer is configured to minimize the capacitance penalty by decreasing the fringing capacitance between the dielectric layer and the etch-stop layer. The transition layer is made of a material that shares a common element with both the deposited barrier layer and the to-be-deposited etch-stop layer. The transition layer in this example is SiCN.

The robot transfers the substrate having the barrier layer and the transition layer deposited thereon to a third processing chamber for deposition of an etch-stop layer. The third processing chamber may be a PVD processing chamber. The etch-stop layer is made of a material that shares an element with the material of the transition layer. In this example, etch-stop layer is AlN. The AlN may be deposited with a target source power of 500 W to 4 kW at pulsed DC mode, with a chamber pressure of 1-15 mTorr, a chuck bias of 0-400 W, and nitrogen gas feeding at 5-150 sccm to tune film composition, and a chuck temperature range from room temperature to 400° C. for density tuning.

Because the transition layer SiCN shares the element Si with the barrier layer SiOC, and because the transition layer SiCN shares the element N with the etch-stop layer AlN, a covalent bond is formed between the layers. The covalent bonds aid in saturating dangling defects, which aids in trap state reduction.

EXAMPLE TWO

The following example may be carried out using the processing system described in FIG. 6 and the PVD chamber described in FIG. 1. A substrate is transferred to a first processing chamber for deposition of a barrier layer. The first processing chamber is a PECVD chamber. The barrier layer deposited on the substrate is an SiOC barrier layer.

The robot transfers the substrate having the barrier layer deposited thereon to a second processing chamber. The second processing chamber may be a remote or in-situ plasma processing chamber that may be capacitively or inductively coupled. The barrier layer SiOC may undergo a pretreatment process. The surface of the barrier layer is treated with NH₃ plasma for nitridation. The chamber is maintained at 300°-400° C., at a pressure of 2-4 Torr, with a plasma power of 100-800 W, and an NH₃ concentration of 1-60%. The pretreatment of the barrier layer creates a good quality interface of the SiOC barrier layer with the subsequent AlN etch-stop layer.

The robot transfers the substrate having the barrier layer having undergone the pretreatment process to a third processing chamber for deposition of an etch-stop layer. The third processing chamber may be a PVD processing chamber. The etch-stop layer is made of a material that shares an element with the material of the transition layer. In this example, etch-stop layer is AlN. The pretreatment of the barrier layer SiOC with NH₃ allows a common element of N to be present at the interface with the etch-stop layer AlN such that a covalent bond may be formed between the layers. The covalent bond aids in saturating dangling defects, which aids in trap state reduction.

EXAMPLE THREE

The following example may be carried out using the processing system described in FIG. 6 and the PVD chamber described in FIG. 1. A substrate is transferred to a first processing chamber for deposition of a barrier layer. The first processing chamber is a PECVD chamber. The barrier layer deposited on the substrate is an SiOC barrier layer.

The robot transfers the substrate having the barrier layer and the transition layer deposited thereon to a second processing chamber for deposition of an etch-stop layer. The second processing chamber may be a PVD processing chamber. The etch-stop layer is made of a material that shares an element with the material of the transition layer. In this example, etch-stop layer is AlN.

The robot transfers the substrate having a barrier layer and an etch-stop layer deposited thereon to a third processing chamber for a post-treatment process. A small molecule penetration approach is used for the post-treatment process. The small molecule penetration approach includes forming a gas anneal (N₂/H₂), hydrogen gas anneal, hydrogen plasma treatment. The small molecules have the capability to penetrate through stack and stitch etch-stop and dielectric barrier surface. The forming gas anneal may be performed at 200°-400° C., 4-10% hydrogen concentration. The hydrogen-based plasma treatment is made at 50-1000 W plasma power, 100°-400° C., 5-100% H₂ concentration.

The post-treatment of the barrier layer SiOC and the etch-stop layer AlN with small molecule penetration allows a common element of N to be present at the interface with the etch-stop layer AlN such that a covalent bond may be formed between the layers. The covalent bond aids in saturating dangling defects, which aids in trap state reduction.

While the foregoing is directed to embodiments of the present disclosure, other and further embodiments of the disclosure may be devised without departing from the basic scope thereof, and the scope thereof is determined by the claims that follow.

What is claimed is:

1. A method for forming an interconnect on a substrate, comprising:
   depositing a continuous barrier layer on the substrate formed from SiOC;
   depositing a transition layer on the barrier layer formed from SiCN after depositing the continuous barrier layer; and
   depositing an etch-stop layer on the transition layer formed from AlN after depositing the transition layer, wherein the transition layer shares a first common element with every layer contacting a bottom surface of the transition layer, and wherein the transition layer shares a second common element with every layer contacting a top surface of the transition layer, the first common element different from the second common element.

2. The method of claim 1, wherein the barrier layer is deposited using a silicon-based precursor.

3. The method of claim 1, wherein the etch-stop layer is formed from a metal dielectric material.

4. The method of claim 1, wherein the transition layer is configured to decrease the fringing capacitance between the barrier layer and the etch-stop layer.

5. The method of claim 1, wherein the first common element shared between the transition layer and the barrier layer forms a first covalent bond between the transition layer and the barrier layer and the second common element shared between the transition layer and the etch-stop layer forms a second covalent bond between the transition layer and the etch-stop layer.

6. The method of claim 5, wherein the first covalent bond and the second covalent bond aid in saturating dangling defects between the transition layer and the etch-stop layer and the transition layer and the barrier layer.

7. An interconnect formed on a substrate, comprising:
   a continuous barrier layer on the substrate formed from SiOC;
   a transition layer on the barrier layer formed from SiCN; and
   an etch-stop layer on the transition layer formed from AlN, wherein the transition layer shares a first common element with every layer contacting a bottom surface of the transition layer, and wherein the transition layer shares a second common element with every layer contacting a top surface of the transition layer, the first common element different from the second common element.

8. The interconnect of claim 7, wherein the barrier layer is formed from a silicon-based precursor.

9. The interconnect of claim 7, wherein the etch-stop layer is formed from a metal dielectric material.

10. The interconnect of claim 7, wherein the first common element shared between the transition layer and the barrier layer forms a first covalent bond between the transition layer and the barrier layer and the second common element shared between the transition layer and the etch-stop layer forms a second covalent bond between the transition layer and the etch-stop layer.

11. The interconnect of claim 10, wherein the first covalent bond and the second covalent bond aid in saturating dangling defects between the transition layer and the etch-stop layer and the transition layer and the barrier layer.

* * * * *